United States Patent
Kim

(10) Patent No.: US 7,302,620 B2
(45) Date of Patent: *Nov. 27, 2007

(54) INTERLEAVING.DEINTERLEAVING DEVICE AND METHOD FOR COMMUNICATION SYSTEM

(75) Inventor: Min-Goo Kim, Songnam-shi (KR)

(73) Assignee: Samsung Electronics Co., Ltd. (KR)

( * ) Notice: Subject to any disclaimer, the term of this patent is extended or adjusted under 35 U.S.C. 154(b) by 323 days.

This patent is subject to a terminal disclaimer.

(21) Appl. No.: 10/975,661

(22) Filed: Oct. 28, 2004

(65) Prior Publication Data

US 2005/0071729 A1    Mar. 31, 2005

Related U.S. Application Data

(63) Continuation of application No. 10/744,752, filed on Dec. 23, 2003, now abandoned, which is a continuation of application No. 09/459,051, filed on Dec. 10, 1999, now Pat. No. 6,668,350.

(30) Foreign Application Priority Data

Dec. 10, 1998    (KR) ............................... 1998-54131

(51) Int. Cl.
*G06F 11/00*    (2006.01)
(52) U.S. Cl. .......................... 714/701; 711/5
(58) Field of Classification Search ............... 714/701; 711/5
See application file for complete search history.

(56) References Cited

U.S. PATENT DOCUMENTS

| | | | |
|---|---|---|---|
| 5,572,532 A | 11/1996 | Fimoff et al. | |
| 5,657,331 A | 8/1997 | Metzner et al. | |
| 6,198,733 B1 | 3/2001 | Prasad | |
| 6,314,534 B1 | 11/2001 | Agrawal et al. | |
| 6,334,197 B1 | 12/2001 | Eroz et al. | |
| 6,493,815 B1 | 12/2002 | Kim et al. | |
| 6,507,629 B1 * | 1/2003 | Hatakeyama | 375/372 |
| 6,668,350 B1 * | 12/2003 | Kim | 714/759 |

FOREIGN PATENT DOCUMENTS

GB    2 328 765    3/1999

(Continued)

OTHER PUBLICATIONS

Jalloul et al., "Performance Analysis of CDMA Transmit Diversity Methods", 1999 IEEE, VTC '99, pp. 1326-1330.

*Primary Examiner*—Guy Lamarre
*Assistant Examiner*—Mujtaba K. Chaudry
(74) *Attorney, Agent, or Firm*—The Farrell Law Firm

(57) ABSTRACT

A device for sequentially storing input bit symbols of a given interleaver size N in a memory at an address from 0 to N−1 and reading the stored bit symbols from the memory. The device comprises a look-up table for providing a first variable m and a second variable J satisfying the equation $N=2^m \times J$; and an address generator for generating a read address depending on the first and second variables m and J provided from the look-up table. The read address is determined by $2^m(K \bmod J)+BRO_m(K/J)$, where K ($0 \leq K \leq (N-1)$) denotes a reading sequence, $BRO_m(y)$ is the bit-reversed m-bit value of y and / is a function in which a quotient of K divided by d is obtained, the quotient being an integer.

8 Claims, 2 Drawing Sheets

FOREIGN PATENT DOCUMENTS

| | | |
|---|---|---|
| JP | 10-013252 | 1/1998 |
| JP | 10-303854 | 11/1998 |
| JP | 11-205159 | 7/1999 |
| WO | WO 99/25069 | 5/1999 |
| WO | WO 00/35101 | 6/2000 |
| WO | WO 00/35103 | 6/2000 |

* cited by examiner

INTERLEAVING.DEINTERLEAVING DEVICE AND METHOD FOR COMMUNICATION SYSTEM

PRIORITY

This application is a continuation of application Ser. No. 10/744,752, filed Dec. 23, 2003 now abandoned, which is a continuation of application Ser. No. 09/459,051, filed Dec. 10, 1999, that issued on Dec. 23, 2003 as U.S. Pat. No. 6,668,350, which claims priority to an application filed in the Korean Intellectual Property Office on Dec. 10, 1998, and assigned Ser. No. 1998-54131, the contents of each of which are incorporated herein by reference.

BACKGROUND OF THE INVENTION

1. Field of the Invention

The present invention relates generally to a communication system, and in particular, to an interleaving/deinterleaving device and method for a radio communication system.

2. Description of the Related Art

Interleaving is typically used in mobile communications to increase the performance of an error correction code in a fading channel, and is intimately associated with decoding of a random error correction code. Particularly, an air interface for an IMT-2000 communication system requires a concrete method for implementing various interleaving techniques. In addition, the methods for interleaving have resulted in an increase in the reliability of digital communication systems, and in particular, have resulted in a performance improvement for existing and future digital communication systems alike.

The IMT-2000 standard provisionally recommends using a bit reverse interleaver for a channel interleaver. However, the forward link and the reverse link defined by the IMT-2000 standard have various types of logical channels, and the interleaver has various sizes. Therefore, in order to solve this variety requirement, there is required the increased memory capacity. For example, in a N=3 forward link transmission mode, there is used an interleaver of various sizes from 144 bits/frame to 36864 bits/frame. A brief description of the bit reversal interleaver will be made below.

FIG. 1 shows a permutation method of the bit reversal interleaver. Referring to FIG. 1, the bit reversal interleaver rearranges frame bits by exchanging bit positions from the most significant bit (MSB) to the least significant bit (LSB), thereby to generate an interleaving address. This interleaving method has the following advantage. Since the interleaver is implemented using an enumeration function, it is simple to use the memory and it is easy to implement interleavers of various sizes. In addition, the bit positions of the permuted sequence are distributed at random in major locations. However, an interleaver having a size which cannot be expressed in terms of a power of 2 has a reduced memory efficiency. For example, to implement the 36864-bit interleaver, there is required a 64 Kbit ($65536=2^{16}$) memory. Since the value 36864 is higher than 32 Kbits ($32768=2^{15}$) an additional bit is needed to represent the number. Therefore, 28672 (=65536−36864) bits are unused in the memory, thereby causing a memory loss. In addition, even though the memory has a sufficient capacity, it is very difficult to implement a method for transmitting the symbols. Further, it is also difficult for the receiver to detect an accurate position of the received symbols. Finally, since various types of interleavers are used, it is necessary to store various interleaving rules in memory thereby requiring a controller (CPU) to have a high memory capacity as well.

The conventional interleaving method has the following disadvantages. First, in the existing interleaving method, the size of the interleaver cannot be expressed in terms of a power of 2, and the interleaver having the larger size is less memory efficient. That is, in most cases, the size of each logical channel is not expressed in terms of $2^m$, therefore the interleaver has a large size when designing an interleaver for the IMT-2000 forward link. Therefore, it is ineffective to use the bit reversal interleaving method.

Second, in the existing interleaving method, it is necessary to store various interleaving rules according to the interleaver sizes in the controller (CPU or host) of the transceiver. Therefore, the host memory requires a separate storage in addition to an interleaver buffer.

Third, the interleaver/deinterleaver has a complex transmission scheme because invalid address should be removed when the interleaver size is set to $2^m$ to perform bit reversal interleaving. Further, the interleaver/deinterleaver has difficulty in synchronizing the symbols.

SUMMARY OF THE INVENTION

It is, therefore, an object of the present invention to provide an interleaving device and method for generating an address for various interleaver sizes using a single algorithm in a communication system.

It is another object of the present invention to provide an interleaving device and method for allowing an interleaver memory to use only a capacity corresponding to a frame size N in a communication system.

To achieve the above objects, there is provided a device for sequentially storing input bit symbols of a given interleaver size N in a memory at an address from 0 to N−1 and reading the stored bit symbols from the memory. The device comprises a look-up table for providing a first variable m and a second variable J satisfying the equation $N=2^m \times J$; and an address generator for generating a read address depending on the first and second variables m and J provided from the look-up table. The read address is determined by $2^m(K \bmod J)+BRO_m(K/J)$, where K ($0 \leq K \leq (N-1)$) denotes a reading sequence, $BRO_m(y)$ is the bit-reversed m-bit value of y, and / is a function in which a quotient of K divided by J is obtained, the quotient being an integer.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

An interleaver/deinterleaver according to an embodiment of the present invention permutes the sequence of input symbols using an interleaving/deinterleaving algorithm and then stores them in an output buffer in a new sequence. Therefore, the interleaver/deinterleaver proposed by the invention comprises three parts: an interleaver memory (input data buffer and output data buffer), an address generator, and an existing counter.

Figure 1:
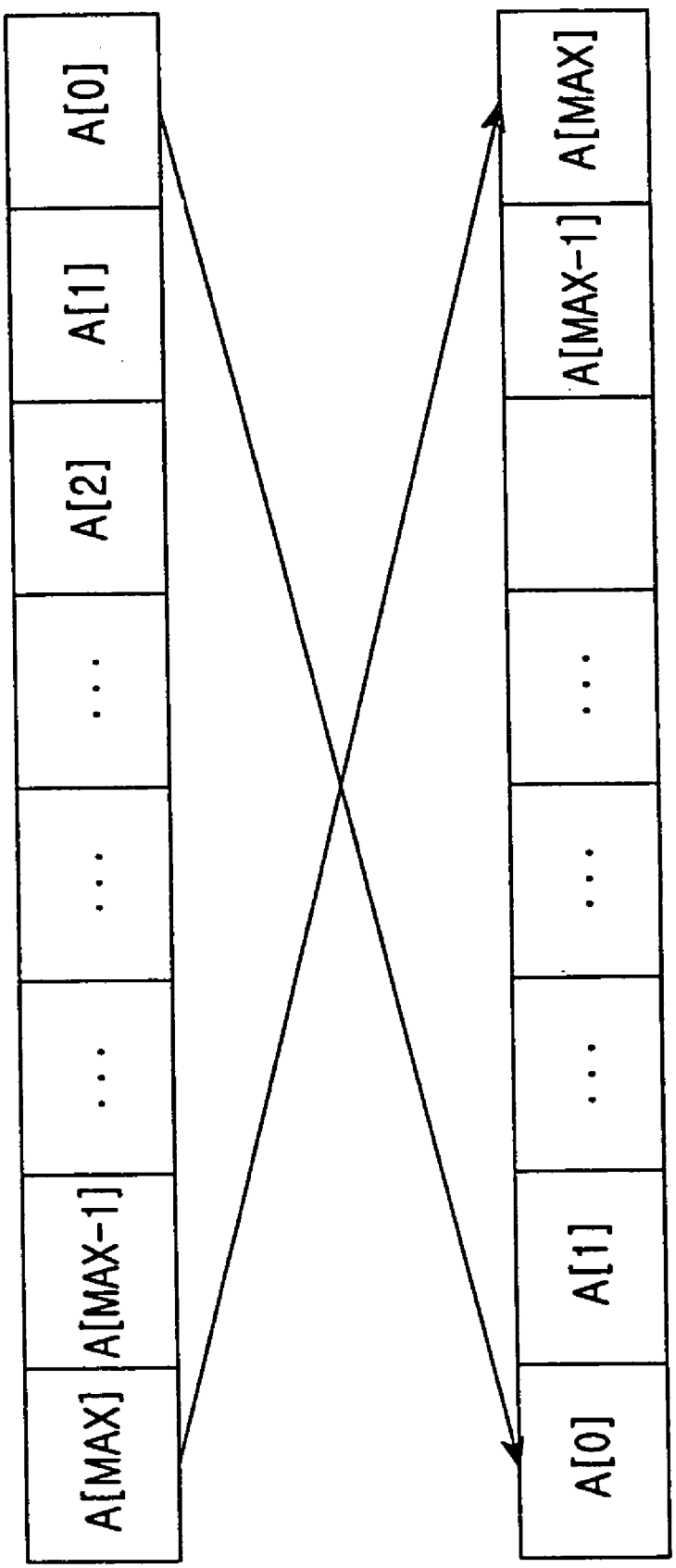
FIG. 1 is a diagram for explaining a permutation method of a bit reversal interleaver according to the prior art.
Figure 2:
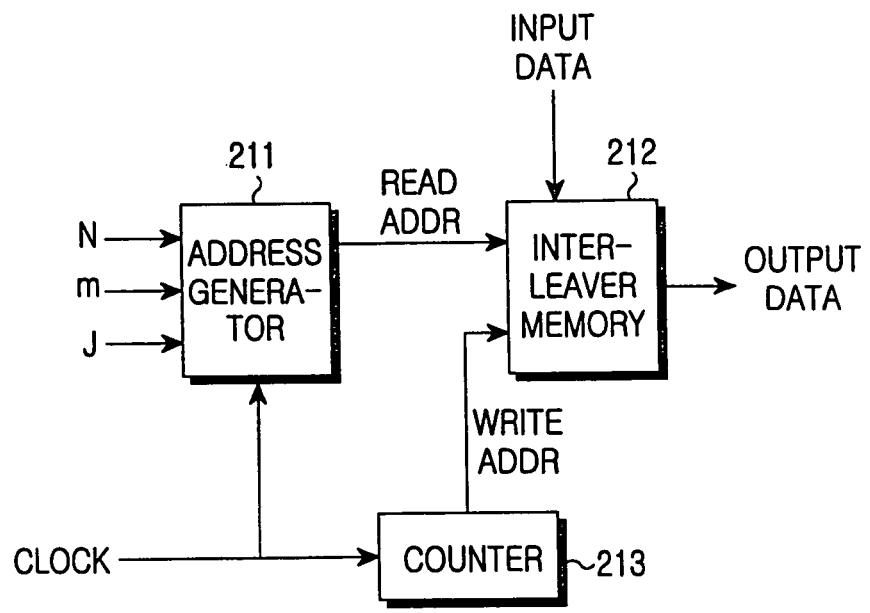
FIG. 2 is a block diagram of an interleaver according to an embodiment of the present invention.

FIG. 2 shows an interleaver according to an embodiment of the present invention. Referring to FIG. 2, an address generator 211 receives an interleaver size value N, a first variable m, a second variable J and a clock, to generate an interleaver memory address for reading bit symbols sequentially stored in an interleaver memory 212. The interleaver memory 212 sequentially stores input bit symbols during a write mode of operation, and outputs the bit symbols according to the address provided from the address generator 211 during a read mode of operation. A counter 213 counts the input clock and provides the clock count value to the interleaver memory 212 as a write address value.

As described above, the interleaver sequentially writes the input data during the write mode of operation, and outputs the data stored in the interleaver memory 212 according to the read address generated from the address generator 211.

Here, the address generator 211 generates the read address (i.e., interleaving address value) according to a partial bit reversal interleaving algorithm defined by Equation (1) below.

For a given $K \ldots (0 \leq K \leq (N-1))$ $r = K \bmod J$;
$PUC = K/J$; $s = BRO_m (PUC)$;
$ADDRESS\_READ = r \times 2^m + s$     [Equation 1]

where 'K' denotes the sequence of output data bits and is referred to as a sequence number; 'm' denotes the number of consecutive zero (0) bits from the LSB to the MSB and is referred as a first variable; and J denotes a value corresponding to a decimal value of the bits except the consecutive zero(0) bits (i.e. m) and is referred to as a second variable. Here, the interleaver size N is defined as $2^m \times J$.

A description will now be made regarding a method of generating the address for reading the input symbols sequentially written in the memory, with reference to Equation (1). Assume that the size of the interleaver is N. In Equation (1), $K(=0,1,2,\ldots,N-1)$ indicates a reading sequence of the input data, and r, PUC, s indicate predetermined variables. Further, 'mod' and '/' indicate each modulo operation and divider operation for calculating the remainder and quotient, respectively. As it would be obvious to a person of ordinary skill in the art, the terms 'mod' in a modulo operation for calculating a remainder and '/' in a divider operation for calculating a quotient occur in the context of the quotient-remainder theorem where a remainder r and a quotient q are integers satisfying the relationship $n = d \times q + r$, where $0 \leq r < d$. In addition, $BRO_m(H)$ indicates the bit-reversed m-bit value of H, a process that converts H to a binary value and then converts that achieved value to a decimal value by reverse ordering the binary value from the MSB to the LSB. The resulting decimal value is the value representing the bit reversed binary value. Therefore, by using the function of Equation (1), the interleaver may calculate the read sequence index ADDRESS_READ corresponding to 'K' of the input data sequence and read the contents of the memory according to the read sequence index ADDRESS_READ. The first and second variables are determined by the interleaver size. Once the interleaver size N and the first and second variables are determined, the interleaver generates, depending on these values, a new addressing index ADDRESS_READ corresponding to each K according to the following algorithm, and reads the data from the interleaver memory 212 using the addressing index ADDRESS_READ.

A description will now be made regarding a method for determining the first and second variables from the frame size (or interleaver size) N. A predetermined interleaver size N is expressed as a binary value. Further, the number of consecutive '0' bits which continue from the LSB to the MSB is calculated and then defined as first variable m. Thereafter, the truncated bits other than the consecutive zero bits are assembled and converted to a decimal value. The converted decimal value is defined as the second variable J.

For example, when N=576, it can be converted to a binary value of $N = [10\ 0100\ 0000]$, so that m=6 and $J = (1001)_2 = 9$.

Figure 3:
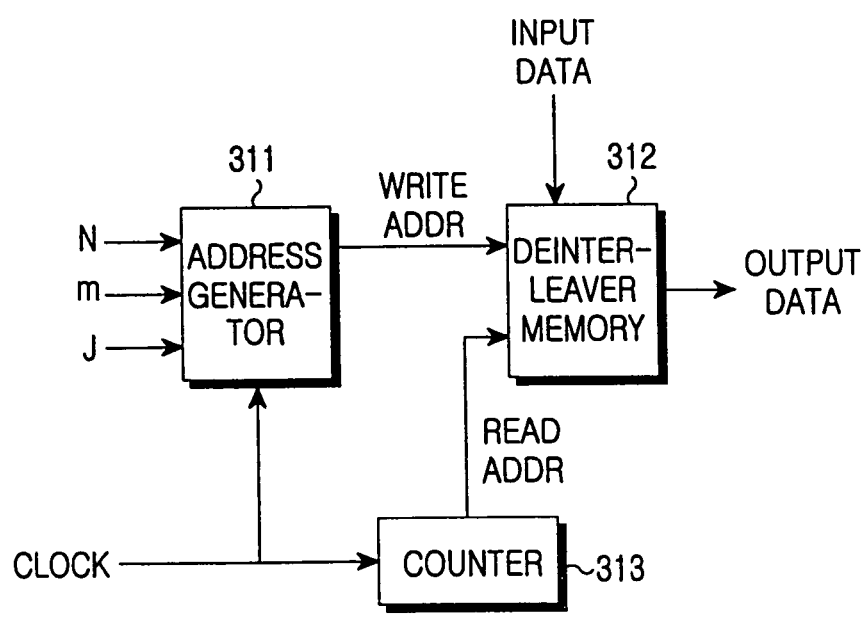
FIG. 3 is a block diagram of a deinterleaver according to an embodiment of the present invention.

FIG. 3 shows a deinterleaver having a reverse operation of the above interleaver.

Referring to FIG. 3, an address generator 311 generates a deinterleaver memory address for performing a write mode of operation by receiving an interleaver size value N, a first variable m, a second variable J and a clock. Address generator 311 provides the generated deinterleaver memory address to a deinterleaver memory 312. The deinterleaver memory 312 stores input data according to the write address provided from the address generator 311 during a write mode of operation, and sequentially outputs the stored data during a read mode of operation. A counter 313 counts the input clock and provides the clock count value to the deinterleaver memory 312 as a read address value.

The deinterleaver has the same structure as the interleaver and has the reverse operation of the interleaver. That is, the deinterleaver is different from the interleaver in that input data is stored in the deinterleaver memory 312 using the algorithm of Equation (1) during the write mode of operation, and the data is sequentially read during the read mode of operation. That is, the deinterleaver stores the data in the original sequence during the write mode in order to restore the original sequence of the data transmitted from the transmitter.

For convenience, the description below will now be made with reference to the interleaver. The reference will be made to an embodiment which is applied to the IMT-2000 system being a further mobile communication system.

First, with reference to Table 1 below, a detailed description will be made regarding the interleaver size used in the forward link of the IMT-2000 system.

TABLE 1

|  | F-FCH (RS1) | F-FCH (RS2) | F-SCH (RS1) | F-SCH (RS2) | F-CCCH | F-SYNC CH | F-PCH | F-DCCH |
|---|---|---|---|---|---|---|---|---|
| 72 (bit) |  |  |  |  |  |  |  |  |
| 144 | ○ (5 msec) | ○ (5 msec) |  |  |  |  |  | ○ (5 msec) |
| 192 |  |  |  |  |  | ○ (26.6 msec) |  |  |
| 288 |  |  |  |  |  |  |  |  |

TABLE 1-continued

|  | F-FCH (RS1) | F-FCH (RS2) | F-SCH (RS1) | F-SCH (RS2) | F-CCCH | F-SYNC CH | F-PCH | F-DCCH |
|---|---|---|---|---|---|---|---|---|
| 384 |  |  |  |  |  |  |  |  |
| 576 | ○ | ○ | ○ | ○ | ○ |  | ○ | ○ (20 msec) |
| 1152 |  | ○ | ○ | ○ |  |  |  |  |
| 2304 |  |  | ○ | ○ |  |  |  |  |
| 4608 |  |  | ○ | ○ |  |  |  |  |
| 9216 |  |  | ○ | ○ |  |  |  |  |
| 18432 |  |  | ○ | ○ |  |  |  |  |
| 36864 |  |  | ○ | ○ |  |  |  |  | where F-FCH stands for a forward fundamental channel, F-SCH for a forward supplemental channel, F-CCCH for a forward common control channel, F-SYNC CH for a forward sync channel, F-PCH for a forward paging channel, and F-DCCH for a forward dedicated control channel.

It is noted from Table 1 that in the IMT-2000 system, there are proposed 12 interleaver sizes (N=12) each applied to the forward logical channels as indicated by 'O'. For example, a forward fundamental channel F-FCH (for Rate Set 2) uses 144-bit, 576-bit and 1152-bit interleaver sizes, wherein a 5 ms frame is used for the 144-bit interleaver size.

Shown in Table 2 below are the first variable m and the second variable J calculated for the interleaver sizes of Table 1.

TABLE 2

| Interleaver Size (N) | Binary Value for N | J | m | Logical Channel |
|---|---|---|---|---|
| 144 | 10010000 | 9(1001) | 4 | 5 msec/frame F-DCCH (5 msec/frame) F-FCH/RS2 (5 msec/frame) |
| 192 | 1100000 | 3(0011) | 5 | F-SYNC CH (26.22 msec/frame) |
| 576 | 1001000000 | 9(1001) | 6 | F-PCH F-CCCH F-DCCH (20 msec/frame) F-FCH/RS2 F-SCH/RS1 |
| 1152 | 10010000000 | 9(1001) | 7 | F-FCH/RS2 F-SCH |
| 2304 | 100100000000 | 9(1001) | 8 | F-SCH |
| 4608 | 1001000000000 | 9(1001) | 9 | F-SCH |
| 9216 | 10010000000000 | 9(1001) | 10 | F-SCH |
| 18432 | 100100000000000 | 9(1001) | 11 | F-SCH |
| 36864 | 1001000000000000 | 9(1001) | 12 | F-SCH |

With reference to Table 2, a description will be made regarding a method for calculating the first and second variables for the interleaver size of N=9216. First, the interleaver size 9216 can be expressed as a binary value of N=[10 0100 0000 0000]. For this binary value, the maximum number of consecutive zero (0) bits from the LSB to the MSB is calculated, and then the calculated value is defined as the first variable m. Thereafter, the truncated bits other than the consecutive zero bits are assembled and converted to a decimal value (1001=9$_{(10)}$). This decimal is called the second variable J.

Tables 3 and 4 below show the write and read modes for N=576 interleaver, respectively way of example.

TABLE 3

| 1 | 2 | 3 | 4 | 5 | 6 | 7 | 8 | 9 |
|---|---|---|---|---|---|---|---|---|
| 10 | 11 | 12 | 13 | 14 | 15 | 16 | 17 | 18 |
| 19 | 20 | 21 | 22 | 23 | 24 | 25 | 26 | 27 |
| 28 | 29 | 30 | 31 | 32 | 33 | 34 | 35 | 36 |
| 37 | 38 | 39 | 40 | 41 | 42 | 43 | 44 | 45 |
| 46 | 47 | 48 | 49 | 50 | 51 | 52 | 53 | 54 |
| 55 | 56 | 57 | 58 | 59 | 60 | 61 | 62 | 63 |
| 64 | 65 | 66 | 67 | 68 | 69 | 70 | 71 | 72 |
| 73 | 74 | 75 | 76 | 77 | 78 | 79 | 80 | 81 |
| 82 | 83 | 84 | 85 | 86 | 87 | 88 | 89 | 90 |
| 91 | 92 | 93 | 94 | 95 | 96 | 97 | 98 | 99 |
| . | . | . | . | . | . | . | . | . |
| . | . | . | . | . | . | . | . | . |
| 541 | 542 | 543 | 544 | 545 | 546 | 547 | 548 | 549 |
| 550 | 551 | 552 | 553 | 554 | 555 | 556 | 557 | 558 |
| 559 | 560 | 561 | 562 | 563 | 564 | 565 | 566 | 567 |
| 568 | 569 | 570 | 571 | 572 | 573 | 574 | 575 | 576 |

TABLE 4

| 1 | 65 | 129 | 193 | 257 | 321 | 385 | 449 | 513 |
|---|---|---|---|---|---|---|---|---|
| 33 | 97 | 161 | 225 | 289 | 353 | 417 | 481 | 545 |
| 17 | 81 | 145 | 209 | 273 | 337 | 401 | 465 | 529 |
| 49 | 113 | 177 | 241 | 305 | 369 | 433 | 497 | 561 |
| 9 | 73 | 137 | 201 | 265 | 329 | 393 | 457 | 521 |
| 41 | 105 | 169 | 233 | 297 | 361 | 425 | 489 | 553 |
| 25 | 89 | 153 | 217 | 281 | 345 | 409 | 473 | 537 |
| 57 | 121 | 185 | 249 | 313 | 377 | 441 | 505 | 569 |
| 5 | 69 | 133 | 197 | 261 | 325 | 389 | 453 | 517 |
| . | . | . | . | . | . | . | . | . |
| . | . | . | . | . | . | . | . | . |
| 16 | 80 | 144 | 208 | 272 | 336 | 400 | 464 | 528 |
| 48 | 112 | 176 | 240 | 304 | 368 | 432 | 496 | 560 |
| 32 | 96 | 160 | 224 | 288 | 352 | 416 | 480 | 544 |
| 64 | 128 | 192 | 256 | 320 | 384 | 448 | 512 | 576 |

In the write mode of operation, the input data bits are sequentially stored in the interleaver memory 212 from an address 000 to an address 575, as shown in Table 3 which shows the corresponding orders 1 to N of the address 0 to N−1. Next, in the read mode of operation, the data bits are output from the interleaver memory 212 using the read address generated from the address generator 211.

As an example, for a third output data bit (k=2), a calculation of a corresponding read address will be described with reference to Equation (1). First, for N=576, m=6 and J=9. Therefore r=2 mod 9=2, and PUC =2/9=0. In addition, s=$BRO_6(0)$=0. As a result, the finally calculated read address ADDRESS_READ=2×$2^6$=128. In the read mode of the interleaver as shown in Table 4 corresponding orders of the output addresses are shown as 1 to N. That is, all output addresses obtained from Equation(1) are added by 1, respectively.

As an another example, for a 20th output data bit (k=19), a calculation of a corresponding read address will be described with reference to Equation (1). For N=576, m=6 and J=9. Therefore, r=19 mod 9=1, and PUC =19/9=2. In addition, s=$BRO_6(2)$=BRO($000010_2$). When "$000010_2$" is converted to a decimal value after bit reversing, the result is "$16_{10}$".

As a result, the finally calculated address ADDRESS_READ=$2^6 \times 1+16$ =80. In the read mode of the interleaver as shown in Table 4, the output address is 81 which is obtained by adding 1 to the calculated result.

Tables 5 and 6 below show the write and read modes for N=144 interleaver, respectively, by way of another example.

TABLE 5

| 1 | 2 | 3 | 4 | 5 | 6 | 7 | 8 | 9 |
|---|---|---|---|---|---|---|---|---|
| 10 | 11 | 12 | 13 | 14 | 15 | 16 | 17 | 18 |
| 19 | 20 | 21 | 22 | 23 | 24 | 25 | 26 | 27 |
| . | . | . | . | . | . | . | . | . |
| . | . | . | . | . | . | . | . | . |
| . | . | . | . | . | . | . | . | . |
| 136 | 137 | 138 | 139 | 140 | 141 | 142 | 143 | 144 |

TABLE 6

| 1 | 17 | 33 | 49 | 65 | 81 | 97 | 113 | 129 |
|---|----|----|----|----|----|----|-----|-----|
| 9 | 25 | 41 | 57 | 73 | 89 | 105 | 121 | 137 |
| 5 | 21 | 37 | 53 | 69 | 84 | 101 | 117 | 133 |
| . | . | . | . | . | . | . | . | . |
| . | . | . | . | . | . | . | . | . |
| . | . | . | . | . | . | . | . | . |
| 16 | 32 | 48 | 64 | 80 | 96 | 112 | 128 | 144 |

In the write mode of operation, the input data bits are sequentially stored in the interleaver memory 212 from an address 000 to an address 143, as shown in Table 5. Next, in the read mode of operation, the data bits are output from the interleaver memory 212 using the read address generated from the address generator 211.

As an example, for a 22nd output data bit (k=21), a calculation of a corresponding read address will be described with reference to Equation (1). For N=144, m=4 and J=9. Therefore, r=21 mod 9=3, and PUC=21/9=2. In addition, s=$BRO_4(2)$=BRO($0010_2$). When "$0010_2$" is converted to a decimal value after bit reversing , the result is "$4_{10}$". If the bit reversal occurred with bit greater than m, the resulting read address would be an address out of the interleaver memory and would render the interleaver inoperable. If the bit reversal occurred with bits less than m, the bit reversal would eliminate valid bits that are to be reversed. As a result, the finally calculated address ADDRESS_READ=$2^4 \times 3+4$=52. In the read mode of the interleaver as shown in Table 4, the output address is 53 which is obtained by adding 1 to the calculated result. If the bit reversal occurred with bit greater than m, the resulting read address would be an address out of the interleaver memory and would render the interleaver inoperable. If the bit reversal occurred with bits less than m, the bit reversal would eliminate valid bits that are to be reversed.

As another example, for a 14th output data bit (k=13) a calculation of a corresponding read address will be described with reference to Equation (1). For N=144, m=4 and J=9. Therefore, r=13 mod 9=4, and PUC=13/9=1. In addition, s=$BRO_4(1)$=BRO($0001_2$). When "$0001_2$" is converted to a decimal value after bit reversing, the result is "$8_{10}$". As a result, the finally calculated address ADDRESS_READ=$2^4 \times 4+8$=72. In the read mode of the interleaver as shown in Table 4, the output address is 73 which is obtained by adding 1 to the calculated result.

Tables 7 and 8 below show the write and read modes for N=1152 interleaver, respectively, by way of the other example.

TABLE 7

| 1 | 2 | 3 | 4 | 5 | 6 | 7 | 8 | 9 |
|---|---|---|---|---|---|---|---|---|
| 10 | 11 | 12 | 13 | 14 | 15 | 16 | 17 | 18 |
| 19 | 20 | 21 | 22 | 23 | 24 | 25 | 26 | 27 |
| . | . | . | . | . | . | . | . | . |
| . | . | . | . | . | . | . | . | . |
| . | . | . | . | . | . | . | . | . |

TABLE 8

| 1 | 128 | 257 | 385 | 513 | 641 | 769 | 897 | 1025 |
|---|-----|-----|-----|-----|-----|-----|-----|------|
| 65 | 193 | 321 | 449 | 577 | 705 | 833 | 961 | 1089 |
| 33 | 161 | 289 | 417 | 545 | 673 | 801 | 929 | 1057 |
| . | . | . | . | . | . | . | . | . |
| . | . | . | . | . | . | . | . | . |
| . | . | . | . | . | . | . | . | . |

In the write mode of operation, the input data bits are sequentially stored in the interleaver memory 212 from an address 000 to an address 1151, as shown in Table 7. Next, in the read mode of operation, the data bits are output from the interleaver memory 212 using the read address generated from the address generator 211.

As an example, for a 12th output data bit (k=11), a calculation of a corresponding read address will be described with reference to Equation (1). For N=1152, m=7 and J=9. Therefore, r=11 mod 9=2, and PUC =11/9=1. In addition, s=$BRO_7(1)$=BRO($0000001_2$). When "$0000001_2$" is converted to a decimal value after bit reversing , the result is "$64_{10}$". If the bit reversal occurred with bit greater than m, the resulting read address would be an address out of the interleaver memory and would render the interleaver inoperable. If the bit reversal occurred with bits less than m, the bit reversal would eliminate valid bits that are to be reversed. As a result, the finally calculated address ADDRESS_READ=$2^7 \times 2+64$=320. In the read mode of the interleaver as shown in Table 8, the output address is 321 which is obtained by adding 1 to the calculated result.

As an another example, for a 23rd output data bit (k=22) a calculation of a corresponding read address will be described with reference to Equation (1). For N=1152, m=7 and J=9. Therefore, r=22 mod 9=4, and PUC=22/9=2. In addition, s =$BRO_7(2)$=BRO($0000010_2$). When "$0000010_2$" is converted to a decimal value after bit reversing, the result is "$32_{10}$". As a result, the finally calculated address ADDRESS_READ=$2^7 \times 4+32$=544. In the read mode of the interleaver as shown in Table 8, the output address is 545 which is obtained by adding 1 to the calculated result.

As described above, the invention has proposed an effective address generating method for various interleaver sizes which cannot be expressed in terms of a power of 2. This solves the low memory efficiency problem of the existing interleaver. In addition, it is possible to generate an address for various interleaver sizes using a single algorithm. Therefore, it is not necessary for the host (or CPU) to store separate interleaving rules for the respective interleaver sizes, thereby saving memory capacity. Furthermore, the interleaver memory uses only the capacity corresponding to the frame size N, thus increasing memory efficiency.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for sequentially storing N input bit symbols in a memory at an address from 0 to N−1 and for reading the stored bit symbols from the memory, comprising the steps of:
sequentially storing input bit symbols of a given interleaver size N in a memory at an address from 0 to N−1;
providing a first variable m and a second variable J satisfying the equation N=$2^m$×J; and
reading a Kth (0≦K≦(N−1)) bit symbol at an address determined by $$2^m(K \bmod J) + BRO_m(K/J)$$

where $BRO_m(y)$ is the bit-reversed m-bit value of y, where y=K/J, and / is a function in which a quotient of K divided by J is obtained, the quotient being an integer.

2. The method as claimed in claim 1, wherein the first variable m indicates the number of consecutive zero (0) bits from the least significant bit (LSB), when the size N is expressed as a binary value.

3. The method as claimed in claim 1, wherein the second variable J indicates a decimal value corresponding to the truncated bits other than consecutive zero bits from the LSB, when the size N is expressed as a binary value.

4. A method for sequentially storing input bit symbols of a given interleaver size N in a memory at an address from 0 to N−1 and reading the stored bit symbols from the memory, wherein a bit symbol is read at an address determined by the equation $2^m$×r+s, wherein when the interleaver size N is expressed as a binary value, an integer equal to or smaller than the number of consecutive zero bits from the LSB is defined as a first variable m, a decimal value determined by converting a binary value corresponding to the truncated bits other than the consecutive zero bits is defined as a second variable J, a decimal value determined by expressing a quotient obtained by dividing a reading sequence K (0≦K≦(N−1)) by the second variable J, as a binary value with m bits bit reversing said binary value and converting the bit-reversed binary value to said decimal value is defined as a fourth variable s, and a remainder determined by dividing the reading sequence K by the second variable J is defined as a third variable r, the quotient being an integer.

5. A device for interleaving an input bit symbols, the device comprising:
memory to store the input bit symbols of a given interleaver size N at an address from 0 to N−1; and
an address generator to generate a read address depending on a first and second variables m and J provided from the memory, the read address being determined by $$2^m(K \bmod J) + BRO_m(K/J)$$

where the first and second variable m and J satisfying the equation N=$2^m$×J, K (0≦K≦(N−1)) denotes a reading sequence, $BRO_m(y)$ is the bit-reversed in-bit value of y, where y=K/J, and / is a function in which a quotient of K divided by J is obtained, the quotient being an integer.

6. The device as claimed in claim 5, wherein the first variable m indicates the number of consecutive zero bits from the LSB, when N is expressed as a binary value.

7. The device as claimed in claim 6, wherein the second variable J indicates a decimal value corresponding exclude the consecutive zero bits from the LSB, when the size N is expressed as a binary value.

8. A device for sequentially storing input bit symbols of a given interleaver size N in a memory at an address from 0 to N−1 and reading a bit symbol stored at an address R from the memory, the device comprising:
means for providing a first variable m and a second variable J satisfying the equation N=$2^m$×J; and
means for generating a read address depending on the first and second variables m and J provided from the providing means, the read address being determined by $$2^m(K \bmod J) + BRO_m(K/J)$$

where K (0≦K≦(N−1)) denotes a reading sequence, and $BRO_m(y)$ is the bit-reversed m-bit value of y, where y=K/J, and / is a function in which a quotient of K divided by J is obtained, the quotient being an integer.

* * * * *